United States Patent [19]
Graf et al.

[11] Patent Number: 4,647,954
[45] Date of Patent: Mar. 3, 1987

[54] LOW TEMPERATURE TUNNELING TRANSISTOR

[75] Inventors: Volker Graf, Wollerau; Pierre L. Gueret, Richterswil; Carl A. Mueller, Hedingen, all of Switzerland

[73] Assignee: International Business Machines Corporation, Armonk, N.Y.

[21] Appl. No.: 654,707

[22] Filed: Sep. 27, 1984

[30] Foreign Application Priority Data

Dec. 28, 1983 [EP] European Pat. Off. ........ 83113163.6

[51] Int. Cl.$^4$ ............................................. H01L 29/78
[52] U.S. Cl. ................................... 357/23.3; 357/23.2; 357/22; 357/4; 357/15; 357/28
[58] Field of Search ...................... 357/22, 4 SL, 23.2, 357/15, 23.3, 28

[56] References Cited

U.S. PATENT DOCUMENTS

| | | | |
|---|---|---|---|
| 3,500,137 | 3/1970 | Schroen et al. | 317/235 |
| 3,882,533 | 5/1975 | Döhler | 357/4 SL |
| 4,157,555 | 6/1979 | Gray | 357/6 |
| 4,194,935 | 3/1980 | Dingle | 357/4 SL |
| 4,220,959 | 9/1980 | Kroger | 357/5 |
| 4,334,158 | 6/1982 | Faris | 307/462 |
| 4,494,016 | 1/1985 | Ronsom | 357/22 |

OTHER PUBLICATIONS

Patent Abstracts of Japan, vol. 7, No. 17 (E-154)(1162), Jan. 22, 1983; & JP-A-57 176 781 (Tokyo Shibaura Denki K.K.) 30-10-1982.
Radio Engineering and Electronic Physics, vol. 22, No. 11, Nov. 1977, pp. 107–113, Washington, USA; V. N. Alfeyev, "Amplification Properties of Superconductor–Semiconductor Contacts".
IBM Technical Disclosure Bulletin, vol. 19, No. 4, Sep. 1976, p. 1461–Fang et al. entitled "Superconducting Field-Effect Transistor".
G. H. Doehler in Phys. Status Solidi (b) 52, 79 (1972).
G. H. Doehler in Phys. Status Solidi (b) 52, 533 (1972).
G. H. Doehler, J. Vac. Sci. Technol. 16(3) May/Jun. 1979, p. 851.

*Primary Examiner*—Martin H. Edlow
*Attorney, Agent, or Firm*—Carl C. Kling

[57] ABSTRACT

The transistor comprises two electrodes, source (12) and drain (13), with a semiconductor tunnel channel (11) arranged therebetween. A gate (14) for applying control signals is coupled to the channel. The semiconductor, at low temperatures, behaves like an insulator with a low barrier (some meV) through which charge carriers can tunnel under the influence of an applied drain voltage. The tunnel current can be controlled by a gate voltage $V_G$ which modifies the barrier height between source and drain thereby changing the tunnel probability.

19 Claims, 17 Drawing Figures

LOW TEMPERATURE TUNNELING TRANSISTOR

CROSS REFERENCE TO RELATED APPLICATION

This application claims priority, under the International Convention for the Protection of Industrial Property, from European Patent application Ser. No. 83113163.6, filed Dec. 28, 1983 in the European Patent Office.

The invention relates to a low temperature tunneling transistor and particularly to a device comprising two electrodes with a semiconductor barrier material arranged therebetween through which tunneling currents may flow. The device may be utilized, for example, as a switching device in memory or logic circuitry as well as have applications as an analog signal amplifier.

Various transistors for very low temperature operations have been proposed which offer, particularly if superconducting materials are used, substantial advantages such as low power dissipation, high package density and high speed both at the device and system level. Some of the more promising structures are discussed below.

U.S. Pat. No. 4,220,959 Kroger, JOSEPHSON TUNNEL JUNCTION WITH POLYCRYSTALLINE SILICONE, GERMANIUM OR SILICON-GERMANIUM ALLOY TUNNELING BARRIER, Sept. 2, 1980, discloses a Josephson tunnel junction device having a polycrystalline semiconductor tunneling barrier comprised of silicon, germanium or an alloy thereof. The barrier height is, during fabrication, controlled by appropriate doping of the semiconductor material. In operation, the device is controlled by applying magnetic fields by means of a control line approximate to and electrically insulated from the superconducting electrodes.

U.S. Pat. No. 3,500,137, Schroen et al, CRYOGENIC SEMICONDUCTOR DEVICES, Mar. 10, 1970, discloses a cryogenic electronic device comprising a semiconductor channel permitting superconducting carrier transport and operated analogously to field effect transistors. Both depletion mode and enhancement mode operations are described. A first gate is provided to apply an electric field to the channel. This field either depletes or enhances the conducting region. A second gate can be used to apply a magnetic field to the channel in order to switch the superconducting region to the normal resistive state.

In the article "Superconducting Field-Effect Transistor" (IBM Technical Disclosure Bulletin, Vol. 19, No. 4, September 1976, p. 1461) a device utilizes the effect of electric fields on a superconductor film. A field applied to a control gate increases the charge concentration in the surface of the superconductor whereby the critical temperature $T_c$ is also increased. With proper choice of the device operating temperature, the applied electrical field causes the film to switch from normal-conducting to superconducting.

The so-called Gray-Transistor is described in U.S. Pat. No. 4,157,555, Gray, SUPERCONDUCTING TRANSISTOR, June 5, 1979. The device consists of two tunnel junctions, injector and collector, that are formed in a sandwich structure of superconductor (S) and isolating oxides (I) layers. In operation, quasi-particles are injected into the center superconductor whereby the tunneling probability in the collector barrier is increased. Current gain depends on a collector multiplication effect—introduced quasi-particles may undergo energy changes and cross the barrier more than once—tied to long recombination times.

U.S. Pat. No. 4,334,158, Faris, SUPERCONDUCTING SWITCH AND AMPLIFIER DEVICE, June 8, 1982, discloses another superconducting tunnel junction transistor which became known as the Quiteron. The disclosed device structure is similar to that of the Gray-transistor in that it comprises an injector junction and an acceptor junction formed by three superconducting electrodes with tunnel barriers located therebetween. In operation, heavy quasi-particle injection into the center electrode changes the superconducting band gap of that electrode drastically. This, in turn, affects the current in the acceptor junction, providing current gain.

None of the hitherto proposed devices use the concept of the present invention, wherein a control voltage is applied to affect the tunnel barrier of an adequately doped semiconductor barrier layer which, at cryogenic temperatures, behaves like an insulator since the carriers are essentially "frozen."

For transistors operating at cryogenic temperatures there are several desired device properties, including voltage/current gain, high speed, high package density potential, good isolation properties, and low power consumption. In addition, simple structures adequate for large scale integration techniques are needed.

A main object of the present invention is to provide a high speed transistor permitting sub-picosecond switching times and operating with control signals in the mV range. Another object is to provide a transistor of simple structure, with sub-micron lateral device dimensions, that is easy to manufacture and that allows for high package density. Small dimensions and low signal levels should also provide for low power consumption at cryogenic operating temperatures.

The invention as claimed is intended to meet the above objectives. The hereinafter described low temperature tunneling transistor, comprising a semiconductor barrier arranged between two electrodes, is characterized in that at least one gate terminal for applying control signals is connected to the semiconductor barrier material, and in that, at operating temperature, the material and dimensions of the semiconductor barrier are such that the tunnel current dominates the current of thermionically excited carriers and that the difference in energy between the Fermi-level and either the conduction band minimum or the Valence band maximum of the semiconductor is in the order of meV, forming a low height energy barrier permitting control of the tunneling current by means of signals in the mV range applied to the gate terminal.

The advantages offered by the invention are mainly the fast operation of the device which is due to the small dimensions made possible by the simple structure and to the inherent properties of devices utilizing the tunnel effect. The achieved low power consumption allows high package density and thus high system speeds.

Several ways of carrying out the invention are described in detail below with reference to drawings which illustrate specific embodiments of the invention and in which FIG. 1 shows a schematic cross-section of a transistor according to the invention.

Figure 1:
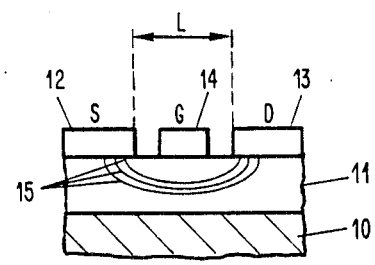

The basic structure of the proposed tunneling transistor is sketched in FIG. 1. On an isolating substrate 10 a semiconductor channel 11 is arranged with source 12, drain 13 and gate 14 electrodes attached thereto. The paths of the current flowing between source and drain are indicated and designated 15. In a first embodiment, to be described in more detail below, the source and drain electrodes consist of superconductor metal. Calculations have, however, shown that normal metal electrodes can also be used. The semiconductor channel 11 between source and drain electrodes should essentially behave, at cryogenic operating temperatures, as an insulator with a low energy barrier of a few meV. The channel is short enough so as to allow significant tunneling of charge carriers (quasi-particles, electrons, or holes) through it under the influence of an applied drain voltage $V_D$. At cryogenic temperatures, the carriers in the semiconductor are essentially frozen. Conditions are chosen such that tunnel currents dominate currents of thermionically excited carriers. The tunnel current can be controlled by a voltage $V_G$, applied to the gate electrode 14, which lowers or increases the height of the tunnel barrier between source and drain, thereby affecting the tunnel probability.

At a first glance, the structure looks very much like a conventional FET device in which currents flowing through the semiconductor channel connecting source and drain are controlled by increasing or decreasing a depletion zone adjacent to the gate electrode, whereby the channel cross-section available for carrier transport is affected. As will be apparent from the following description, both the operation and the device features of the inventive transistor differ substantially from that of an FET.

Figure 2:
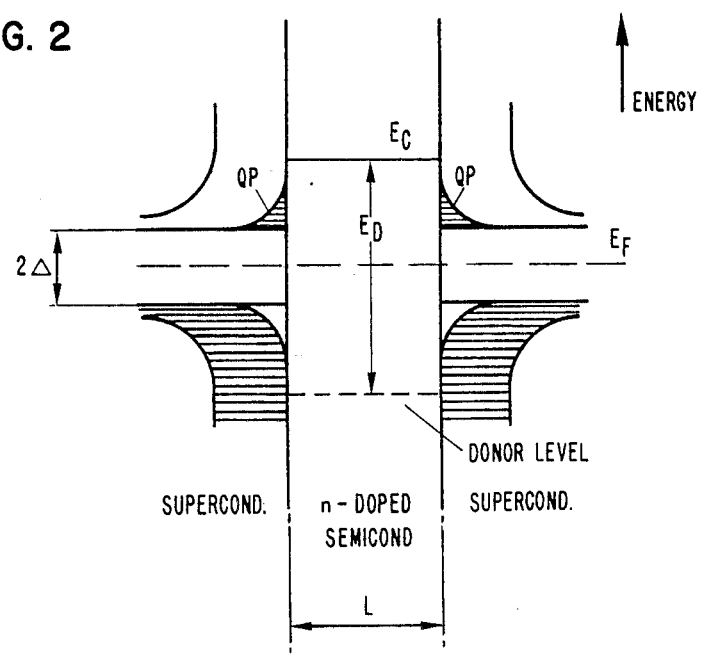
FIG. 2 shows the energy band diagram of the transistor illustrated in FIG. 1 utilizing a n-doped semiconductor tunnel current channel.

In a first embodiment in accordance with FIG. 1, the electrodes, source S and drain D, consist of superconductor material. In the example, niobium (Nb) is used. The distance L between these electrodes—in between which the gate electrode G is placed—is approximately 100 nm. The channel is formed by a layer of n-type semiconductor material. Here, gallium arsenide (GaAs) is used, but other materials such as germanium (Ge) or silicon (Si) are suitable as well. This semiconductor material is doped such that, at cryogenic temperatures, the difference in energy between the conduction band and the Fermi-level is in the range of the gap energy of the superconductor material forming the electrodes. With proper choice of materials and dopants, a low barrier for the quasi-particle tunnel current through the semiconductor barrier can thus be obtained. This is illustrated in FIG. 2, showing the energy diagram of the device. $E_C$ is the conduction band level, $E_D$ the difference between $E_C$ and the donor level. The Fermi-level is designated $E_F$. As it is known, at cryogenic temperatures which may be in the order of 4° K., $E_F$ lies approximately mid-way between the conduction band level $E_C$ and the dopant level at $E_C - E_D$. For the superconductor electrodes the band gap $V_g = 2\Delta$ and the curves representing the density of states as a function of the energy are shown. The areas designated QP illustrate the quasi-particles with above-gap energies that are available at finite temperatures for tunneling through the semiconductor barrier.

Tin (Sn) or selenium (Se) provide donor levels in GaAs which are about 6 meV below $E_C$. This yields, at low enough temperatures, a Fermi-level $E_F$ of about 3 meV below $E_C$ and, as illustrated in FIG. 2, with a superconductor band gap $V_g = 2\Delta$ of about 2 meV the barrier height $\Phi_o$ is as low as 2 meV. $\Phi_o$ being the energy barrier of the semiconductor channel for the quasi-particles of the lowest conduction band with neither $V_D$ (drain voltage) nor $V_G$ (gate voltage) applied.

For arsenic (As)- or phosphorus (P)-doped Ge, the Fermi-level would lie about 6 meV below $E_C$. Further control of the location of the Fermi-level can be achieved through the amount of dopant.

If the tunnel current $I_T$ through the semiconductor channel of length L and voltage barrier $V_B$ is to dominate the current of carriers which are thermionically excited over the energy barrier, the following approximate condition is to be fulfilled.

$$A \sqrt{V_B} \cdot L << \frac{V_B}{kT} \qquad (1)$$

since the tunnel current is proportional to exp$(-A\sqrt{V_B} \cdot L)$ whereas the excited carrier current is proportional to exp$(-V_B/kT)$. For barrier heights in the meV range, the device must, therefore be operated at low temperatures T as long as channel lengths L of less than about 100 nm are difficult to realize.

At very low temperatures, e.g. 4° K., the carriers in the semiconductor are virtually all frozen and the semiconductor is basically an insulator—its Fermi-level is then lying only a few millivolts below the conduction band.

As described above, the barrier $\Phi_o$ for quasi-particle tunneling between the two superconductor electrodes is in the order of the few meV. This holds true also for the effective barrier height $\Phi$ that results when a voltage $V_D$ is applied between the source and drain electrode.

Control of the tunneling barrier height Φ and thus of the tunnel current through the barrier can be achieved with mV signals $V_G$ applied to the gate electrode G that is connected to the semiconductor.

Figure 3:
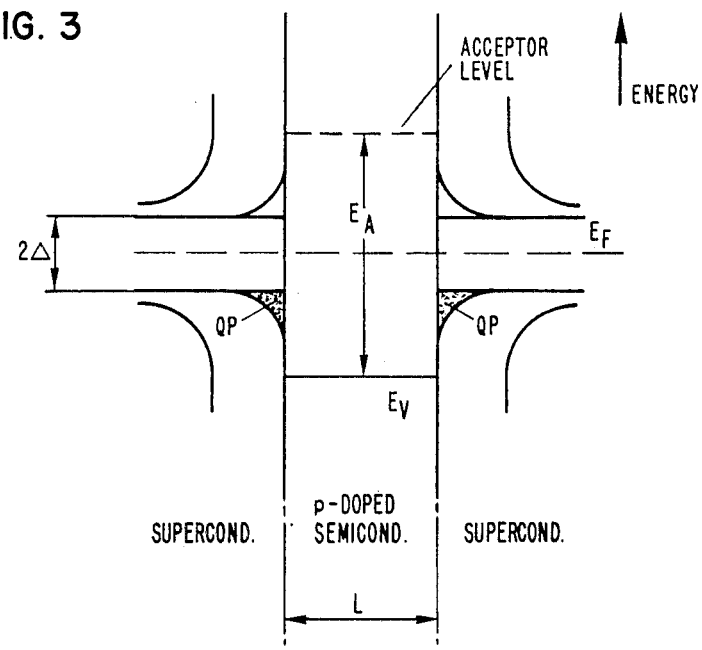
FIG. 3 shows the energy band diagram of the transistor illustrated in FIG. 1 utilizing a p-doped channel.

What has been described above for a transistor employing a n-type semiconductor channel applies, with reversed gate voltage, also to hole tunneling for a p-type semiconductor the energy diagram of which is depicted in FIG. 3. Here, $E_V$ is the valence band level, $E_A$ the difference between $E_V$ and the acceptor level.

Figure 4:
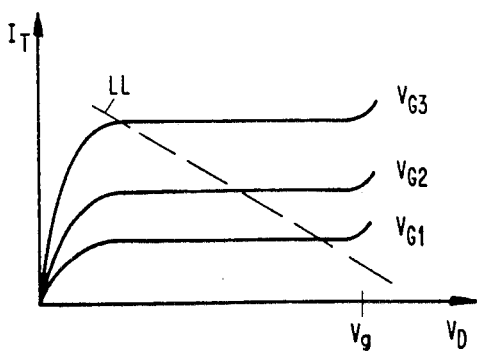
FIG. 4 shows schematically the quasi-particle tunneling characteristics of the transistor illustrated in FIG. 1.

FIG. 4 schematically illustrates the quasi-particle tunneling characteristics of the transistor. For various voltages $V_G$ applied to the gate, the $I_T - V_D$ curves are plotted. Above a certain minimum value of $V_D$, the curves show a strong insensitivity of the tunnel current to changes in the source-drain voltage, i.e. the characteristic is very similar to that of a pentode. The current is determined essentially by the BCS density of states (in the case of superconductive electrodes), by the geometry, and by the height of the barrier which, in turn, is affected by the applied gate voltage $V_G$.

By applying a mV input signal to the gate to change the height of the barrier, a large change in the current is obtained which is due to the exponential dependence of the tunnel current $I_T$ on voltage:

$$I_T \simeq I_o \cdot \exp(-A \cdot \sqrt{\Phi + gV_G} \cdot s) \quad (2)$$

where
- $I_o$ = constant factor
- $\Phi$ = barrier height
- g = effective gate coupling factor
- $V_G$ = input gate voltage
- s = length of tunneling barrier
- $A = 1.025\ (m_c/m_o)^{\frac{1}{2}}$
- $m_c/m_o$ = ratio of effective to free electron mass in the semiconductor With the GaAs channel (A≃3), a barrier length s of 100 nm and a barrier height Φ of 3 mV, a change of 1 mV in the barrier height changes the current by a factor of about 10 to 20.

The dotted loadline LL represents the function $V_T = V_D - I_T \times R_I$ wherein $V_T$ = voltage drop across the transistor when the drain voltage $V_D$ is applied through a resistor $R_L$.

The device speed is ultimately limited by the tunneling time between source and drain. Various expressions for this time appear in the literature. We shall use here the one recently derived by Büttiker and Landauer (Phys. Review Letters, Vol. 49, no. 23, Dec. 6, 1982), giving for a uniform barrier $$\tau_T \simeq \sqrt{\frac{m^*}{2q\Phi_B}} \cdot s \quad (3)$$

from which an order of magnitude estimate of the ultimate speed can be obtained. For an average tunneling barrier height $q \cdot \Phi_B = 10$ meV, a tunneling distance s = 100 nm and an effective mass $m^* = m_o/25$, the above expression yields $\tau_T \simeq 0.33$ psec.

With the aid of FIG. 5 (A to E) a fabrication process employing conventional self-aligning techniques is outlined that is suitable for the deposition of the gate electrode of less than 100 nm width on the semiconductor channel. This is critical because of the required small distance of 100 nm between the source and drain electrodes.

Figure 5A:
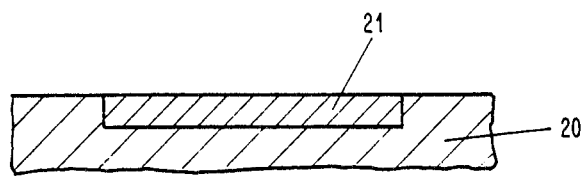
FIG. 5 (A through E) shows the steps of a process for fabricating the electrode structure of the transistor illustrated in FIG. 1.
Figure 5B:
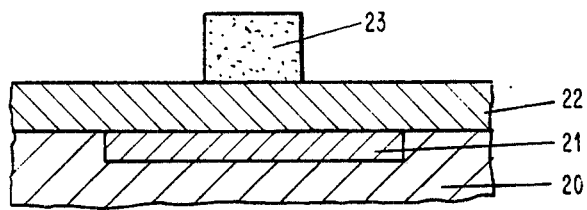
Figure 5C:
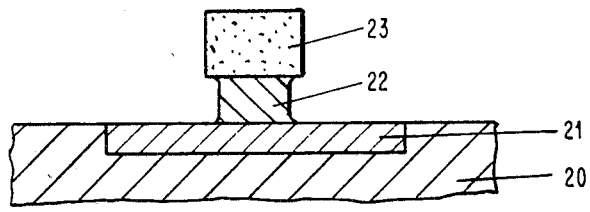
Figure 5D:
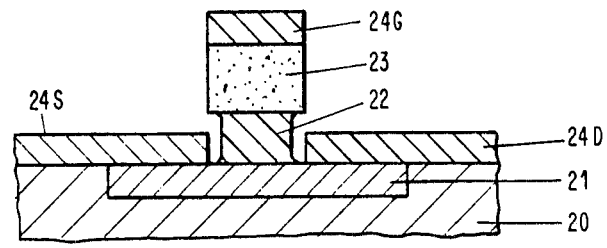
Figure 5E:
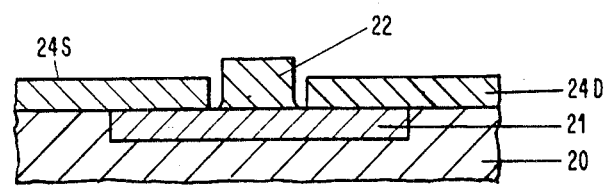

FIG. 5A shows an isolating substrate 20 consisting of undoped GaAs with an embedded barrier layer 21 of 100 to 300 nm thickness obtained by ion implantation or epitaxial growth. FIG. 5B illustrates the result of the next two steps: A Nb-layer 22 of about 200 nm thickness which, after patterning, will provide for the gate electrode is first deposited. In a second step, a photoresist stencil 23, 100 nm wide, is applied through a mask. Its width eventually determines the distance between the source and drain electrodes of the transistor. FIG. 5C illustrates the result of a subsequent plasma etching process by which the Nb-layer not covered by the photoresist is removed. This etching process can be well controlled to obtain, at high plasma pressure, isotropic etching which results in the undercut shown in the figure. This undercut reduces the width of the gate electrode 22 to less than 100 nm. Next, as shown in FIG. 5D, a Nb-layer 24 of about 100 nm thickness is evaporated onto the whole structure. Finally, a lift-off process results in the removal of the Nb-material 24G and the photoresist stencil 23 located on top of the gate electrode. FIG. 5E then is the cross-sectional view of the basic transistor structure. Layers 24S and 24D form the source and drain electrodes, respectively. The spacing in between these electrodes is 100 nm and both are in contact with the GaAs layer 21 serving as tunnel current channel having the desired barrier properties. The gate electrode is formed by layer 22 within the 100 nm spacing between the electrodes but clearly separated therefrom.

Only the basic and critical process steps have been shown in FIG. 5. Others, e.g. those required for patterning of the source and drain electrodes that can be achieved by simple conventional photoresist/lift-off techniques, have been omitted in order to keep the illustration simple.

As described above, current flow in the transistor is controlled by input voltages applied to the gate electrode. Effective coupling between the gate electrode and the barrier channel is essential if applied voltage signals are to change the height of the tunneling barrier over most of the barrier region, i.e. over most of the length of the channel. Particularly the voltage gain depends substantially on this coupling.

However, there are basically two contradictory requirements. First, the gate electrode should preferably be spaced from the channel in order to not divert a substantial part of the total tunnel current. On the other hand, the gate must be close to the channel in order to achieve good coupling of the control voltage into the semiconductor channel—to the extent possible over the whole length and depth of the channel.

Figure 6:
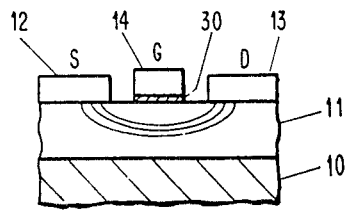
FIG. 6 shows a schematic cross-section of an isolated gate transistor structure wherein the isolation is provided by an oxide layer.
Figure 7:
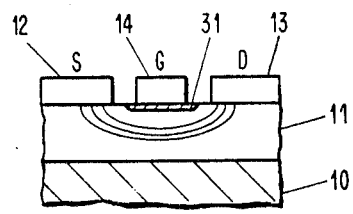
FIG. 7 shows a schematic cross-section of an isolated gate transistor structure wherein the isolation is provided by a Schottky barrier.
Figure 8:
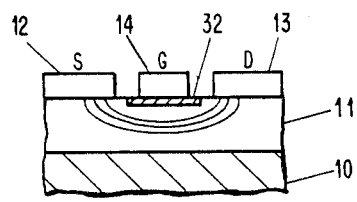
FIG. 8 shows a schematic cross-section of an isolated gate transistor structure wherein the isolation is provided by a large band gap layer formed at the surface of the semiconductor channel.

Both requirements can be met by proper isolation of the gate electrode from the semiconductor. FIGS. 6, 7 and 8 show examples of how this can be achieved by providing a suitable barrier between the tunneling channel and the gate. This barrier needs to be thin compared to the distance separating the gate from the tunneling channel in order to keep the loss in voltage small.

In the device illustrated in FIG. 6, the gate isolation is provided by an oxide layer 30, the device otherwise being the same as that shown in FIG. 1. When normal oxide, having a barrier height of a few eV, is used an oxide thickness in the order of 2 to 5 nm is sufficient to make the tunneling probability to the gate negligible compared to the source-drain tunneling probability.

When using the process illustrated in FIG. 5, such a thin oxide gate isolation can, for example, be formed in two additional process steps following the fabrication of the embedded barrier layer 21 (FIG. 5A). In a first step a thin Nb-layer (2 to 5 nm) is evaporated which is subsequently, in the second step, anodized to $Nb_2O_5$.

Gate isolation can also be obtained by a Schottky barrier 31 (FIG. 7). Implantation or MBE (Molecular Beam Epitaxy) techniques are well suited for this purpose.

Another way of isolating the gate is to provide a thin large band gap semiconductor layer 32 (FIG. 8) underneath the gate electrode with the semiconductor material of the tunnel current channel remaining unchanged.

Figure 9:
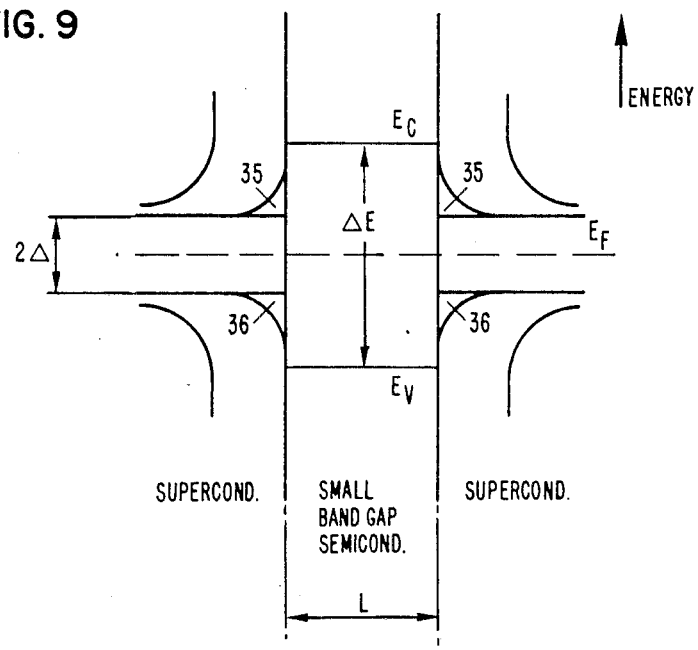
FIG. 9 shows the energy band diagram of a transistor that utilizes a small band gap semiconductor as the tunnel current channel.

In the above described embodiments n-type or p-type semiconductors are being used doped such that they represent a low barrier for the quasi-particle currents. This channel material can be replaced by a small band gap semiconductor, the band gap $\Delta E$ of which being in the order of 5 to 10 meV. The respective energy diagram is depicted in FIG. 9. The operation of the device will remain that described above except that tunneling can also occur via holes through the valence band of the semiconductor barrier in which case operation is with reversed sign of the gate voltage. In the figure, the areas designated 35 and 36 illustrate the carriers, electrons and holes, respectively, that are available at finite temperatures for tunneling through the semiconductor barrier.

Structures utilizing a small band gap channel offer the technological advantage that difficulties which may be caused by non-ohmic barrier formation at the electrode-channel interfaces are of little significance or do not arise at all. For example, alloying antimony (Sb) to bismuth (Bi) yields a continuous transition from metallic Bi to a semiconductor with a maximum band gap energy of $\Delta E = 14$ meV at 12% Sb. If, e.g., a $\Delta E$ of 7 meV is needed this will require a concentration of 8% Sb in the alloy. In principle, alloying allows to adjust the band gap $\Delta E$ continuously to maximum performance of the device. (Reference is made to an article "Temperature Dependence of the Electrical Properties of Bismuth-Antimony Alloys" by A. L. Jain published in the Physical Review, Vol. 114, No. 6, p. 1518, 1959). Other materials, e.g. mixed crystals derived from IV/VI-compounds, are also suitable.

In order to avoid the formation of non-linear barriers at the electrode-channel interfaces, that may be detrimental to the operation of the transistor, further techniques can be applied for providing ohmic contacts. Some are outlined below.

One method is degenerately doping the semiconductor contact interface, so that the carriers can tunnel through the very thin Schottky barrier that is so formed at the surface.

Another method consists of using a metal-semiconductor combination such that the electronegativity of the semiconductor is substantially larger than that of the metal. This latter method usually fails due to the presence of surface states, giving rise to a Schottky barrier in spite of the electronegativity relation. One notable exception is the combination of the semiconductor indium arsenide (InAs) with aluminium (Al), gold (Au), or silver (Ag) as the contacting metal. Another combination is cadmium sulfide (CdS) and Al.

Figure 10:
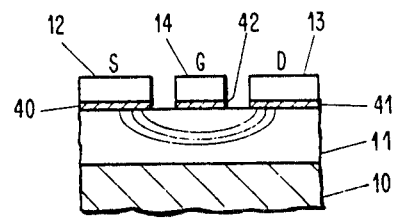
FIG. 10 shows a schematic cross-section of a transistor having interface layers formed between the source and drain electrodes and the semiconductor channel to provide for ohmic contacts.

Applying this latter technique to the structure of the subject tunneling transistor leads to the device schematically shown in FIG. 10 in which the tunneling barrier consists of InAs. Except for the interface layers 40 and 41 and the gate insulator 42 (which can be realized by any of the layers 30, 31 or 32 shown in FIGS. 6, 7 and 8) the device corresponds to that of FIG. 1. To obtain ohmic contacts for the source and drain electrodes, thin layers 40, 41 of Al (or Au or Ag) are deposited in the contact areas. These layers, having thickness in the order of a few 10 nm, are subsequently covered with a suitable superconducting material (like Nb for example) to complete the transistor structure. Due to the proximity effect the thin intermediate Al layers become superconducting and a superconducting ohmic contact to the semiconductor is obtained that is free of a Schottky barrier.

The use of the semiconductor InAs provides for an additional advantage. InAs is a small band gap semiconductor with a low effective electron mass. Since this increases the tunneling probability, it allows using thicker tunneling barriers (which are easier to fabricate) without affecting the device switching speed.

The semiconductor channel of the tunnel transistor can also be formed by a properly doped superlattice structure, e.g., a sandwich of a periodic sequence of ultra-thin n- and p-doped semiconductor layers with intrinsic layers in between. Such structures are also referred to as nipi structures and have been described by G. H. Doehler in Phys. Status Solidi B 52, 79 and 533 (1979) and in J. Vac. Sci. Technol. 16, 851 (1979). These nipi structures permit the design of semiconductors to almost arbitrary specifications in energy band gap, carrier concentration and carrier lifetime. Furthermore, the band gap of such a nipi superlattice structure can be tuned by external voltage signals applied between the n-and p-type layers.

Depending on the doping level, the energy gap $E_g$ for a, e.g., GaAs semiconductor can be adjusted from 0 to $E_{g(o)} = 0.7$ eV which is the energy gap of the unmodulated semiconductor. $E_{g(o)}$ for InSb equals 0.2 eV.

In order to control the transistor with mV signal levels, it is necessary to design the nipi structure so that the band gap and the voltages applied to control the band gap are in the order of a few mV. This can be achieved by growing (e.g., by a MBE process) very thin ($d_n = d_p = 5$ to 10 nm) and alternately (n- and p-type) doped III/V materials (such as GaAs or InSb doped e.g. with beryllium (Be) and silicon (Si) in the range of $2-3 \times 10^{18}/cm3$) with undoped, intrinsic material ($d_i = 0$ to 10 nm) in between. Five periods of such a sandwich make a 50-200 nm thick nipi crystal.

Ohmic contacts to the individual p- and n-doped layers which are required for the electrical tuning of the band gap can be formed by alloying Sn and Sn/Zn layers as n+ and p+ electrodes. Such selective electrodes are ohmic to one type of layer but represent effective blocking p-n junctions to layers of opposite doping.

Figure 11:
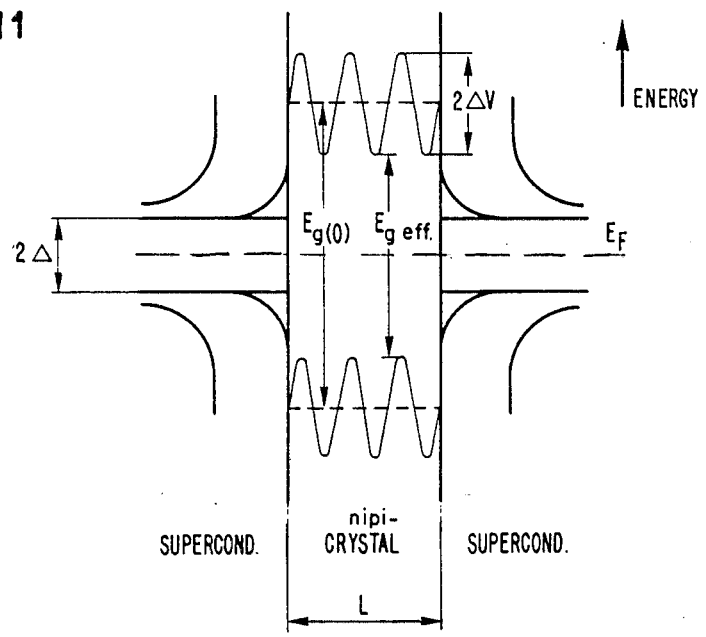
FIG. 11 shows the energy band diagram of a transistor that utilizes a superlattice semiconductor channel.

FIG. 11 shows the band diagram of such a superlattice nipi structure arranged between two superconducting source and drain electrodes. $E_{g(o)}$ is the band gap of the doped semiconductor material used. $E_{g(eff)}$ is the effective band gap of the superlattice. It corresponds to the energy difference between the lowest electron states in the conduction bands and the uppermost hole states in the valence bands and is, as illustrated, reduced by the amount of $2\Delta V$ compared to the unmodulated bulk value $E_{g(o)}$. The properties of nipi crystals allow changing the carrier density via a potential difference $V_{pn}$ applied between the n- and p-contacts, thereby varying the effective band gap, i.e., $E_{g(eff)} = f(V_{pn})$.

Figure 12:
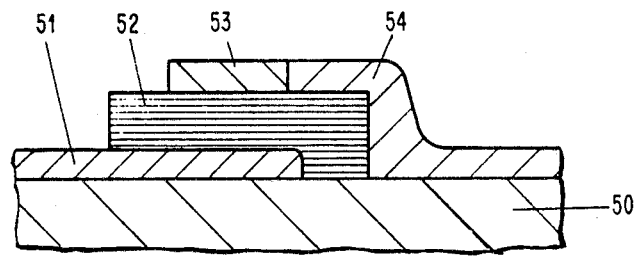
FIG. 12 shows a schematic cross-section of a transistor that utilizes a superlattice semiconductor channel.
Figure 13:
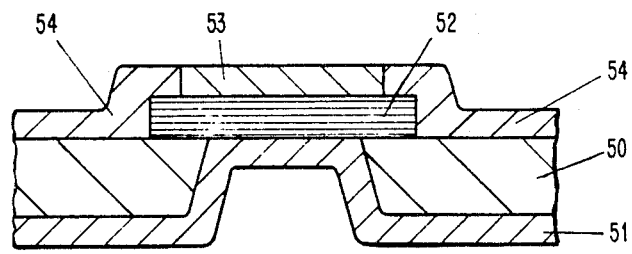
FIG. 13 shows a schematic cross-section of a further transistor that utilizes a superlattice semiconductor channel.

FIGS. 12 and 13 show schematically two embodiments of transistor structures employing such nipi sandwich layers. The nipi sandwich 52, arranged on a semi-insulating substrate 50 of the same material as the nipi tunnel barrier, is contacted by source and drain electrodes 51 and 53, respectively. Layers 54 consist of isolating material. A metallic film, e.g. consisting of AuGe in case of a GaAs nipi structure, may have to be deposited between the nipi sandwich and the superconductor electrodes to provide for ohmic contacts. For simplicity, this metallic film as well as the contacts to the n- and p-layers, to which the control voltage can be applied, have been omitted from the figures which are only used to illustrate how the nipi structure can be arranged with respect to the source and drain electrodes to act as a tunnel barrier of adjustable barrier height.

Investigations have shown that the basic operational principles of the above described SBS (Superconductor-Barrier-Superconductor) device apply also to MBM (Metal-Barrier-Metal) structures where one or both superconducting electrodes are replaced by normal metal electrodes. However, if current transport is to be dominated by tunneling rather than by carriers which are thermally excited over the barrier, the condition expressed in equation (1) must still be met. This means that for barrier heights in the meV range, the MBM transistor has to be operated at low temperatures. For liquid nitrogen operating temperatures higher barrier heights $V_B$ and/or a further reduction of the barrier thickness L are required—conditions that either limit the low control voltage operation capabilities or cause severe problems with today's manufacturing technologies if barrier thicknesses below 100 nm are needed.

It is noted that the inventive concept has been disclosed using planar structure embodiments as examples but that the basic design principles are also applicable to devices having non-planar structures or that may require additional layers or electrodes. Obviously, materials, dimensions and production processes other than those used in connection with the described embodiments may be utilized without departing from the concept of the present invention.

We claim:

1. A tunneling transistor for use at an operating temperature in an environment in the range of liquid helium temperature to liquid nitrogen temperature, comprising:
   (a) doped semiconductor barrier means (11) having, at operating temperature, the composite of doping and of dimensions such that tunnel current dominates the current of thermionically excited carriers, and the difference in energy between the Fermi-level and either the conduction band minimum or the valence band maximum of the semiconductor is on the order of MeV;
   (b) a source electrode (12), connected to said semiconductor barrier means (11) at a first position;
   (c) a drain electrode (13), laterally located at a second position at a finite distance, on the order of 100 nm, from said source electrode (12), across which finite distance tunnel currents may flow in said semiconductor barrier material (11);
   (d) at least one gate electrode (14), operably juxtaposed to said semiconductor barrier material (11), positioned at a third position between said first and second positions for controlling tunneling current in said barrier material (11) by means of signals in the mV range;
   whereby a low height energy barrier permits control of the tunneling current between said source electrode (12) and said drain electrode (13) by means of signals in the mV range applied to said gate electrode (14); and
   (e) means for applying to said gate terminal (14) a control signal in the mV range.

2. A tunneling transistor according to claim 10, wherein said doped semiconductor barrier means (11) is a mixed crystal.

3. A tunneling transistor according to claim 1, for use at an operating temperature in the superconductivity range of temperatures near the temperature of liquid helium, wherein said electrodes consist of one or more thin layers of superconductive material adjacent one or more thin layers of ohmic metallic material of the class which exhibits proximity effect superconductivity in the presence of a covering a layer of superconducting material.

4. A tunneling transistor according to claim 1, wehrein said doped semiconductor barrier (11) means material is CdS and wherein a layer of Al is deposited at said source electrode (12) and drain electrode (13) areas of said doped semiconductor barrier means (11).

5. A tunneling transistor according to claim 1, wherein said source electrode (12) consists of superconducting material at operating temperature.

6. A tunneling transistor according to claim 1 wherein said source electrode (12), said drain electrode (13) and said gate electrode (14) consist of ohmic materials from the group Al, Au, Ag.

7. A tunneling transistor according to claim 5, wherein the difference in energy between conduction band Fermi-level of the semiconductor barrier means (11) metal is in the range of the energy gap of the superconductor electrode.

8. A tunneling transistor according to claim 1, wherein said doped semiconductor barrier means (11) material is n-doped.

9. A tunneling transistor according to claim 1, wherein said doped semiconductor barrier (11) material is p-doped.

10. A tunneling transistor according to claim 1, wherein said doped semiconductor barrier (11) material has a band gap on the order of 5-10 meV.

11. A tunneling transistor according to claim 1, wherein said doped semiconductor barrier means (11) is a nipi superlattice structure (52).

12. A tunneling transistor according to claim 1, wherein said gate electrode (14) is electrically isolated (30, 31, 32) from said doped semiconductor barrier (11).

13. A tunneling transistor according to claim 10, wherein said doped semiconductor barrier (11) material is an alloy of elements.

14. A tunneling transistor according to claim 11, wherein said nipi superlattice structure (52) is formed in a GaAs crystal.

15. A tunneling transistor according to claim 1, wherein said doped semiconductor barrier (11) material is InAs and wherein a layer of a material from the group Al, Au, and Ag is deposited in the area of said source electrode (12) and said drain electrode (13) areas of said semiconductor barrier means (11).

16. A tunneling transistor according to claim 11, wherein said ohmic contacts between said source and drain electrodes and the nipi structure are obtained by depositing a thin film of AuGe between said electrodes and the nipi surfaces.

17. A tunneling transistor according to claim 12, wherein said gate electrode (14) is isolated from said semiconductor (11) by a thin oxide layer (30).

18. A tunneling transistor according to claim 12, wherein said gate (14) is isolated from said semiconductor barrier (11) by a Schottky barrier (31) formed in said semiconductor barrier layer (11) adjacent said gate (14).

19. A tunneling transistor according to claim 12, wherein said gate (14) is isolated from said semiconductor barrier (11) in that a semiconductor layer (32) of material having a band gap significantly greater than 10 meV is formed at said semiconductor surface underneath said gate (14).

* * * * *